(12) United States Patent
Thomas et al.

(10) Patent No.: US 9,375,916 B2
(45) Date of Patent: Jun. 28, 2016

(54) NON-PRINTING REGISTRATION MARKS ON A PRINTING PLATE

(75) Inventors: Pascal Thomas, Hamburg (DE); Nils Kay, Oldendorf (DE); Joachim Scheele, Oldendorf (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 1014 days.

(21) Appl. No.: 13/117,797

(22) Filed: May 27, 2011

(65) Prior Publication Data

US 2011/0308411 A1 Dec. 22, 2011

Related U.S. Application Data

(60) Provisional application No. 61/356,493, filed on Jun. 18, 2010.

(51) Int. Cl.
*B41N 1/00* (2006.01)
*B41F 27/00* (2006.01)
*G03F 9/00* (2006.01)

(52) U.S. Cl.
CPC ........... *B41F 27/005* (2013.01); *G03F 9/00* (2013.01)

(58) Field of Classification Search
CPC ...... B41C 2210/00; B41C 1/105; B41C 1/05; B41C 2210/14; B41N 1/248; B41N 10/04; B41N 2110/06; B41N 10/06; B41F 27/005; B41F 5/24; B41M 1/04

USPC .............................. 101/401.1, 477, 395, 485
See application file for complete search history.

(56) References Cited

U.S. PATENT DOCUMENTS

| | | | | |
|---|---|---|---|---|
| 4,727,806 | A * | 3/1988 | Green, Sr. ................. | 101/415.1 |
| 6,823,793 | B2 * | 11/2004 | Dewitte ....................... | 101/485 |
| 2003/0075257 | A1 | 4/2003 | Salvestro ..................... | 156/64 |
| 2004/0187721 | A1 | 9/2004 | Salvestro .................... | 101/463.1 |
| 2008/0092377 | A1 * | 4/2008 | Heitzinger ................... | 29/846 |
| 2010/0242760 | A1 * | 9/2010 | Otsuka et al. .............. | 101/382.1 |

* cited by examiner

*Primary Examiner* — Matthew G Marini
(74) *Attorney, Agent, or Firm* — Dov Rosenfeld; INVENTEK

(57) ABSTRACT

Creating one or more printing plate segments includes exposing a printing plate segment with imaging data to form an imaged plate segment, and marking the floor of the printing plate segment or the back of the printing plate segment with one or more registration marks according to marking data. The registration marks can be within the design area defined by the imaging data marked such that the registration marks are not visible on a print made from the imaged plate segment. Printing using positioned and mounted so-marked imaged plate segments produces a print without the registration marks visible on the print. Such plate segments can be unmounted and reused with the registration marks intact.

26 Claims, 10 Drawing Sheets

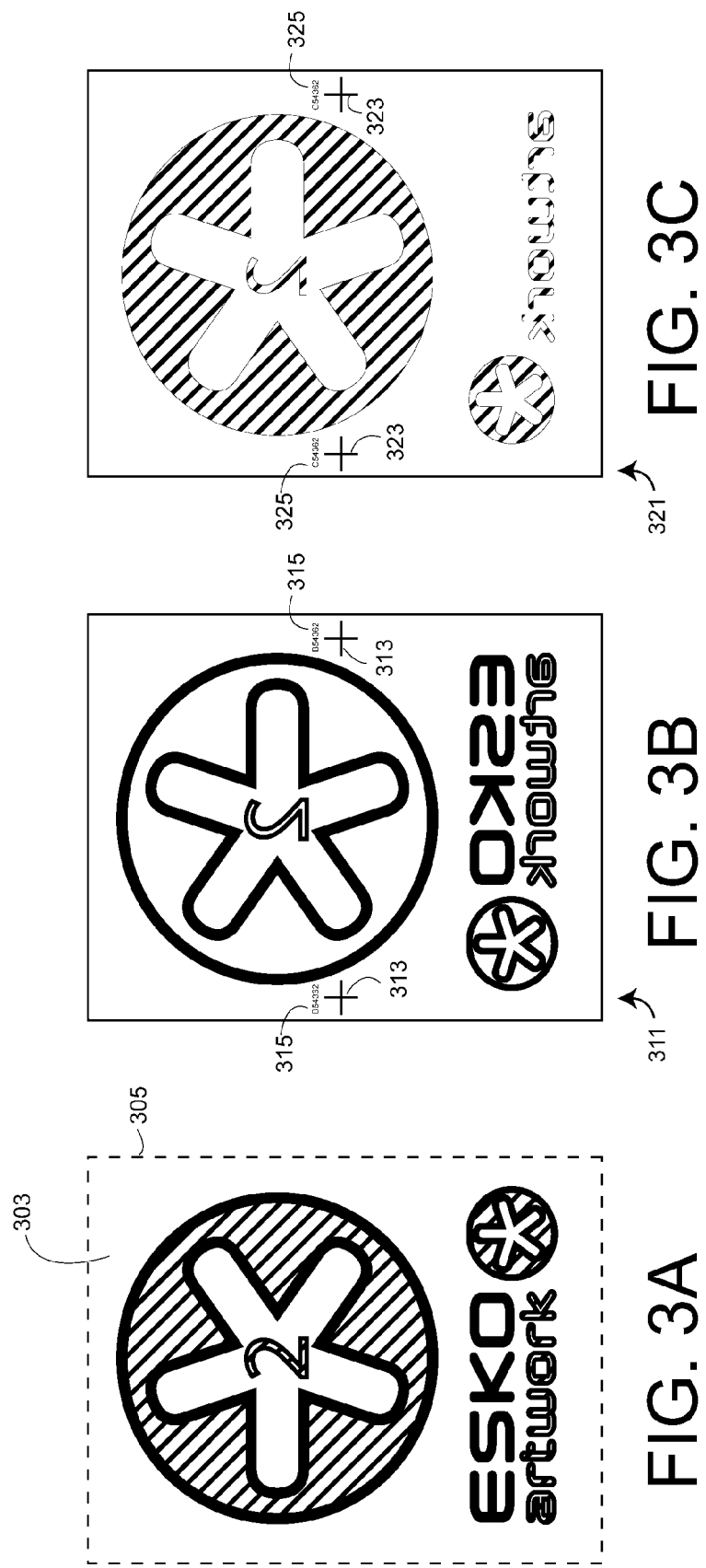

US 9,375,916 B2

NON-PRINTING REGISTRATION MARKS ON A PRINTING PLATE

RELATED PATENT APPLICATIONS

This invention claims benefit of and is a conversion of U.S. Provisional Patent Application No. 61/356,493 filed 18 Jun. 2010 to inventors Thomas et al., titled NON-PRINTING REGISTRATION MARKS ON A PRINTING PLATE. The contents of such U.S. Provisional Patent Application No. 61/356,493 are incorporated herein by reference.

FIELD OF THE INVENTION

The present disclosure relates generally to printing plates, and in particular to a method and apparatus of placing non-printing registration marks on a printing plate.

BACKGROUND

In producing printing plates such as flexographic plates and letterpress plates, a printing plate segment, which can be the whole plate, is exposed using a plate imager, e.g., an imagesetter with imaging data that defines a design area on the imaged plate segment. The imaging data includes registrations marks, e.g., cross shaped marks, or registration microdots, and such registration marks are on the printing surface in the design area. The registrations marks are places outside the area of interest—the design area. The design area in this context is that sensitive area where it is undesired to include any visible marks that are not part of the design. The design area therefore, in this context, excludes, in the case of packaging, the glue flaps or other flaps. Placing the registration marks outside the design area requires a larger plate than if such registration marks were not included. There is an incentive to reduce the amount of printing plate material used. Therefore, it is desired to place registration marks within the design area, but in a manner such that the registration marks are not printed, and furthermore, such that the plates can be re-used, e.g., for additional repeated mounting/printing cycles. Furthermore, it is desired to automate the process of placing the registration marks, such that manual processes are not included.

BRIEF DESCRIPTION OF THE DRAWINGS

FIG. 3A shows a simple example of a design in a design area 303 on a desired print.

FIGS. 3B and 3C show two marked imaged plate segments and used to create sleeves for printing in black and cyan, respectively, and including registration marks according to aspects of the present invention.

FIGS. 7A, 8A, 9A, and 10A show the segments shown in FIG. 6A in more detail, while

DESCRIPTION OF EXAMPLE EMBODIMENTS

Overview

Figure 1:
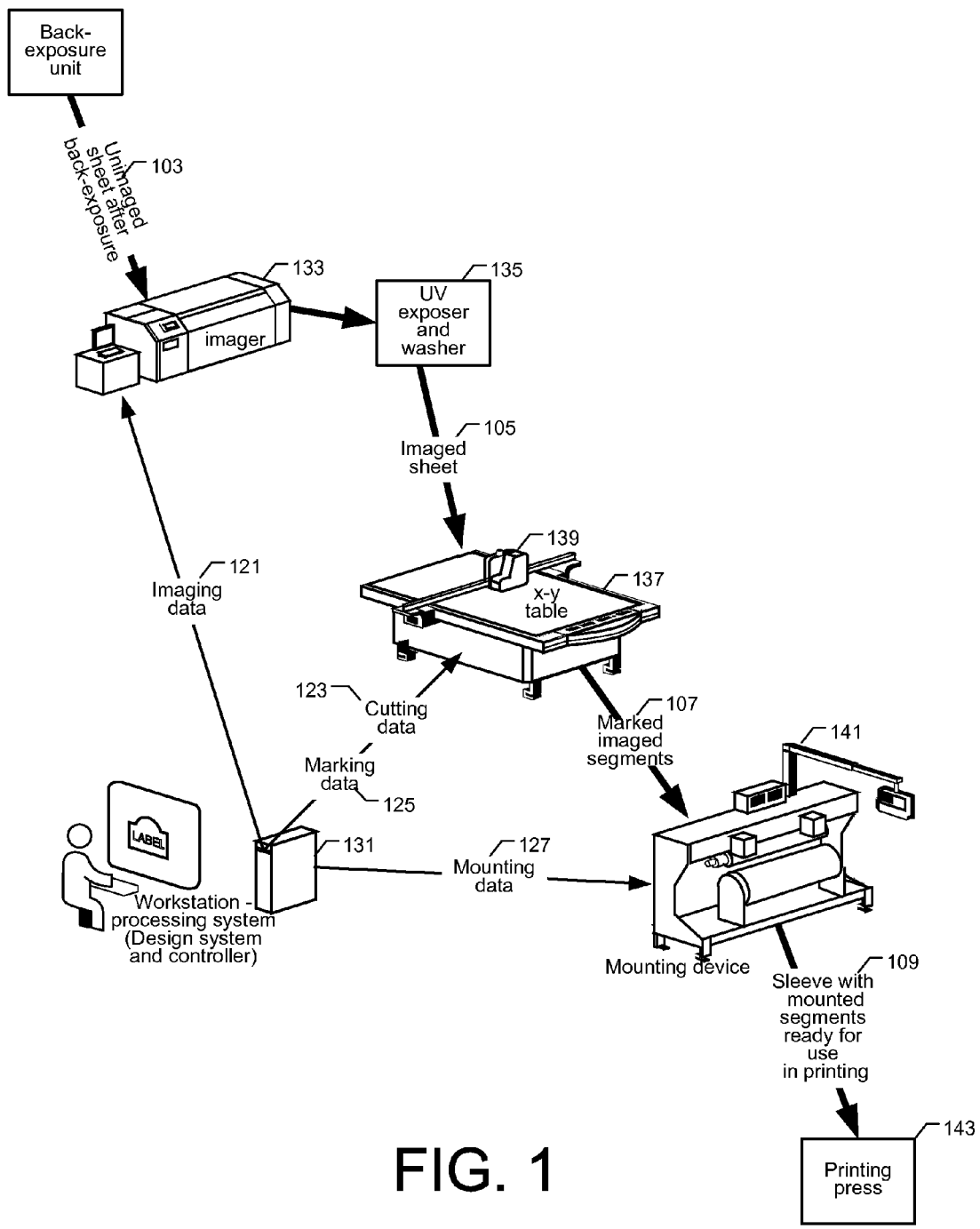
FIG. 1 shows the elements of an example workflow for producing one or more plate segments placed for printing, such a workflow including aspects of the present invention.

Embodiments of the present invention include a method of preparing printing plate segments, including forming registration marks on a printing plate or printing plate segment that are within or outside the design area in a manner such that the registration marks will not be visible on a print made from the plate or plate segment, with the plate or plate segments reusable with the registration marks thereon. Another embodiment is a plate segment made by such a method One embodiment includes a method of creating a printing plate or plate segment comprising: (a) exposing the plate or plate segment with imaging data to form an imaged plate or plate segment, the imaging data defining a design area; and (b) marking the floor of the plate or plate segment or the back of the plate or plate segment with registration marks according to marking data. The registration marks can be within the design area. This marking is such that the registration marks are not visible on a print made from the imaged plate or plate segment. The marking and the exposing produce a marked imaged plate or plate segment. The method further comprises (c) positioning and mounting the marked imaged plate or plate segment on mounting material, using the registration marks to aid positioning. The method is such that printing using the positioned and mounted marked imaged plate or plate segment produces a print without the registration marks visible on the print, and further such that after printing using the mounted marked imaged plate or plate segment, the marked imaged plate or plate segment with the registration marks thereon can be unmounted, and remounted using the registration marks to aid positioning, to form a newly mounted marked imaged plate or plate segment suitable for printing.

In some versions, the marking is on an imaged plate or plate segment after the exposing, while in other versions, the marking is on an unimaged plate or plate segment prior to the exposing.

In some versions, the marking is on the floor of the plate or plate segment, while in other versions, the marking is alternatively or additionally on the back of the plate or plate segment.

In some versions, the marking is carried out automatically on a cutting table using a marking tool controlled by digital data. The marking tool, for example, is one of the set of tools consisting of a laser tool, a knife tool, a drill tool, and a pen tool.

In yet another variation, the sheet prior to back-exposure is placed on an x-y table. The marking of the registration marks onto the one or more plate segments includes placing masking material as registration marks onto the back of the sheet prior to back exposure according to marking data provided from the processing system 131. This marking is carried out using a marking tool that places an amount of UV blocking ink on the back to mark the registration marks.

Particular embodiments include a method of creating one or more marked imaged plate segments mounted on mounting material for printing. The method comprises providing a sheet of plate material, providing imaging data for printing each plate segment, the imaging data for each plate segment including image elements defining a respective design area, and for each plate segment, determining from the imaging data marking data for one or more registration marks. The one or more registration marks can be within or outside the design area. The method further comprises: for each plate segment, providing or determining cutting data for cutting the plate segment, the determining of cutting data from the imaging data; placing the sheet in an imager and exposing the sheet to at least a portion of the imaging data of each plate segment, the portion including the design area, the exposing to form an imaged sheet that includes a set of one or more imaged plate segments; and curing and processing the imaged sheet. The method further comprises for each printing plate segment on the sheet, marking the floor of the printing plate segment or the back of the printing plate segment with one or more registration marks according to marking data, the marking such that the one or more registration marks are not visible on a print made from the imaged plate segment, and wherein the marking and the exposing produce one or more marked imaged plate segments on the sheet. The method further comprises cutting the sheet into segments according to the cutting data to form marked imaged plate segments; and positioning and mounting the one or more marked imaged plate segment on mounting material, using the one or more registration marks of the plate segment to aid the positioning to form one or more positioned and mounted marked imaged plate segments for printing. The method is such that printing using the one or more positioned and mounted marked imaged plate segment produces a print without the registration marks visible on the print, and such that after printing using the positioned and mounted one or more printing plate segments, each plate segment with the registration marks thereon can be unmounted, repositioned, and remounted using the registration marks to aid positioning, to form a newly mounted plate segment suitable for printing.

Particular embodiments include a method of operating a processing system to create data for a workflow of forming one or more marked imaged plate segments mounted on mounting material for printing. The method comprises: providing imaging data for printing each plate segment, the imaging data for each plate segment including image elements defining a respective design area; for each plate segment, determining from the imaging data marking data for one or more registration marks, wherein the one or more registration marks can be within the design area, the marking data for each printing plate segment being for marking the floor of the printing plate segment or the back of the printing plate segment with one or more registration marks, the marking such that the one or more registration marks are not visible on a print made from the imaged plate segment; and for each plate segment, providing or determining cutting data for cutting the plate segment, the determining of cutting data being from the imaging data, the cutting data for use in the workflow. The workflow comprises: providing a sheet of plate material; placing the sheet in an imager and exposing the sheet to at least a portion of the imaging data of each plate segment, the portion including the design area, the exposing to form an imaged sheet that includes a set of one or more imaged plate segments; curing and processing the imaged sheet; for each printing plate segment on the sheet, marking the floor of the printing plate segment or the back of the printing plate segment with one or more registration marks according to the marking data, the marking such that the one or more registration marks are not visible on a print made from the imaged plate segment, and wherein the marking and the exposing produce one or more marked imaged plate segments on the sheet; cutting the sheet into segments according to the cutting data to form marked imaged plate segments; and positioning and mounting the marked imaged plate segment on mounting material, using the one or more registration marks to aid the positioning to form one or more positioned and mounted marked imaged plate segments for printing. The method and workflow are such that printing using the positioned and mounted marked imaged plate segment produces a print without the registration marks visible on the print, and such that after printing using the mounted marked imaged plate segment, the marked imaged plate segment with the registration marks thereon can be unmounted, repositioned and remounted using the registration marks to aid the repositioning, to form a newly mounted marked imaged plate segment suitable for printing.

Particular embodiments include a method of preparing one or more printing plate segments for mounting on mounting material. The method comprises: forming marking data for controlling a marking device to mark one or more registration marks on the back or floor of each of the printing plate segments, the forming using imaging data used to image each of the printing plate segments, the imaging data for each of the printing plate segments defining a design area and usable for exposing each of the printing plate segments with at least a portion of the imaging data. The one or more registration marks for a segment can be the back or floor of the segment within the design area of the segment, such that the one or more registration marks are not visible on a print made from the one or more printing plate segments. The method further comprises forming cutting data for controlling a controllable cutting device to cut out the one or more printing plate segments from a sheet of printed material that has been imaged according to the imaging data to form cut imaged plate segments, and forming mounting information for mounting the cut imaged plate segments on mounting material, the mounting using the registration marks. The method is such that after printing using the positioned and mounted one or more printing plate segments, plate segment with the registration marks thereon can be unmounted, repositioned, and remounted using the registration marks to aid positioning, to form a newly mounted plate segment suitable for printing.

Particular embodiments include a printing plate or printing plate segment suitable for printing, comprising a design area defined by imaging data with which the printing plate or printing plate segment was exposed and one or more registration marks marked on the floor of the printing plate or plate segment or on the back of the plate or plate segment. The one or more registration marks positioned according to marking data, and such marks can be within the design area, such that the one or more registration marks are not visible on a print made from the printing plate or printing plate segment. The plate or plate segment is configured such that positioning and mounting the printing plate or printing plate segment on mounting material using the one or more registration marks to aid positioning, and printing using the positioned and mounted printing plate or printing plate segment produces a print without the registration marks visible on the print. The plate or plate segment also is configured such that after printing using the positioned and mounted printing plate or printing plate segment, the printing plate or plate segment with the registration marks thereon can be unmounted, repositioned, and remounted using the registration marks to aid positioning, to form a newly mounted printing plate or printing plate segment suitable for printing.

Particular embodiments include a tangible computer-readable storage medium configured with a set of instructions that when executed by one or more processors of a processing system cause carrying out a method of creating data for a workflow of forming one or more marked imaged plate segments mounted on mounting material for printing. The method comprises accepting imaging data for printing each plate segment, with the imaging data for each plate segment including image elements defining a design area. The method further comprises for each plate segment, determining from the imaging data marking data for one or more registration marks, wherein the one or more registration marks can be within the design area, the marking data for each printing plate segment being for marking the floor of the printing plate segment or the back of the printing plate segment with one or more registration marks, the marking such that the one or more registration marks are not visible on a print made from the imaged plate segment. The method further comprises for each plate segment, accepting or determining cutting data for cutting the plate segment, the determining of cutting data being from the imaging data, the cutting data for use in the workflow. The workflow comprises: providing a sheet of plate material; placing the sheet in an imager and exposing the sheet to at least a portion of the imaging data of each plate segment, the portion including the design area, the exposing to form an imaged sheet that includes a set of one or more imaged plate segments; curing and processing the imaged sheet; and for each printing plate segment on the sheet, marking the floor of the printing plate segment or the back of the printing plate segment with one or more registration marks according to the marking data, the marking such that the one or more registration marks are not visible on a print made from the imaged plate segment, and wherein the marking and the exposing produce one or more marked imaged plate segments on the sheet. The workflow further comprises cutting the sheet into segments according to the cutting data to form marked imaged plate segments; and positioning and mounting the marked imaged plate segment on mounting material, using the one or more registration marks to aid the positioning to form one or more positioned and mounted marked imaged plate segments for printing. The method and workflow are such that printing using the positioned and mounted marked imaged plate segment produces a print without the registration marks visible on the print, and such that after printing using the mounted marked imaged plate segment, the marked imaged plate segment with the registration marks thereon can be unmounted, repositioned and remounted using the registration marks to aid the repositioning, to form a newly mounted marked imaged plate segment suitable for printing.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

SOME EMBODIMENTS

The present invention is applicable to flexographic printing using flexographic plate segments, and to other forms of printing, such as letterpress printing. While a detailed description is provided herein for the case of flexographic printing, how to modify this description for the case of letterpress printing would be straightforward to one skilled in the art, and the invention is therefor not meant to be limited to flexographic printing.

By a plate segment is meant a segment that once imaged is mounted with other segments onto mounting material, e.g., a sleeve or drum. A plate segment can mean a complete printing plate, or can mean a portion of a plate cut out prior to mounting. The term "plate segment" is therefore not limited to mean to less than a complete plate.

Conventional flexographic plates typically are made of a photopolymer or similar material that is sensitive to ultraviolet (UV) radiation. Exposure to such radiation hardens the material. A floor for the plate is formed by illuminating the back of the plate to UV radiation, this called back-exposure herein. The relief pattern that forms the printable image is formed by exposing the front surface of the plate to UV radiation according to imaging data. Exposure according to the imaging data may be by first producing a mask with an imaging pattern thereon, e.g., using an imagesetter imaging a sheet of mask material according to the imaging data, followed by processing the sheet to form the mask, or in a direct image-to-plate workflow, by exposing a plate that has a mask thereon that is opaque to UV radiation, and ablating the mask using laser illumination on an imagesetter according to imaging data. The resulting plate with the mask thereon is then exposed to UV radiation to harden those parts exposed to the UV light according to the imaging data. Those parts of the plate not exposed to UV radiation are removed, e.g., using solvents and/or water and/or heat, a process we call washing herein.

In some versions, several plate segments on a single sheet of plate material are simultaneously exposed according to the imaging data to form a plurality of plate segments, while in other versions, the whole sheet of plate material forms one plate segment. Thus, in some workflows, there may be a cutting step on a controllable cutting device, e.g., a controllable x-y table on which at least a cutting tool may be mounted. The cutting is carried out on the x-y table using a cutting tool according to cutting data used to control the cutting.

The imaged plate segments are mounted on mounting material, e.g., a drum, press cylinder or sleeve of mounting material. The resulting mounted segments are then used to print.

In such a workflow, there are several points at which placement accuracy is important. In the case a cutting device, e.g., a controllable x-y table is used, e.g., for cutting individual imaged segments from an imaged sheet, there is a need to accurately place the sheet on the table. Each individual segment after cutting also needs to be accurately placed on the mounting material.

Registration marks are often put: (a) on the sheet for placing the sheet on the x-y table; and (b) on each segment for placing the imaged segment accurately on the mounting material.

Figure 2:
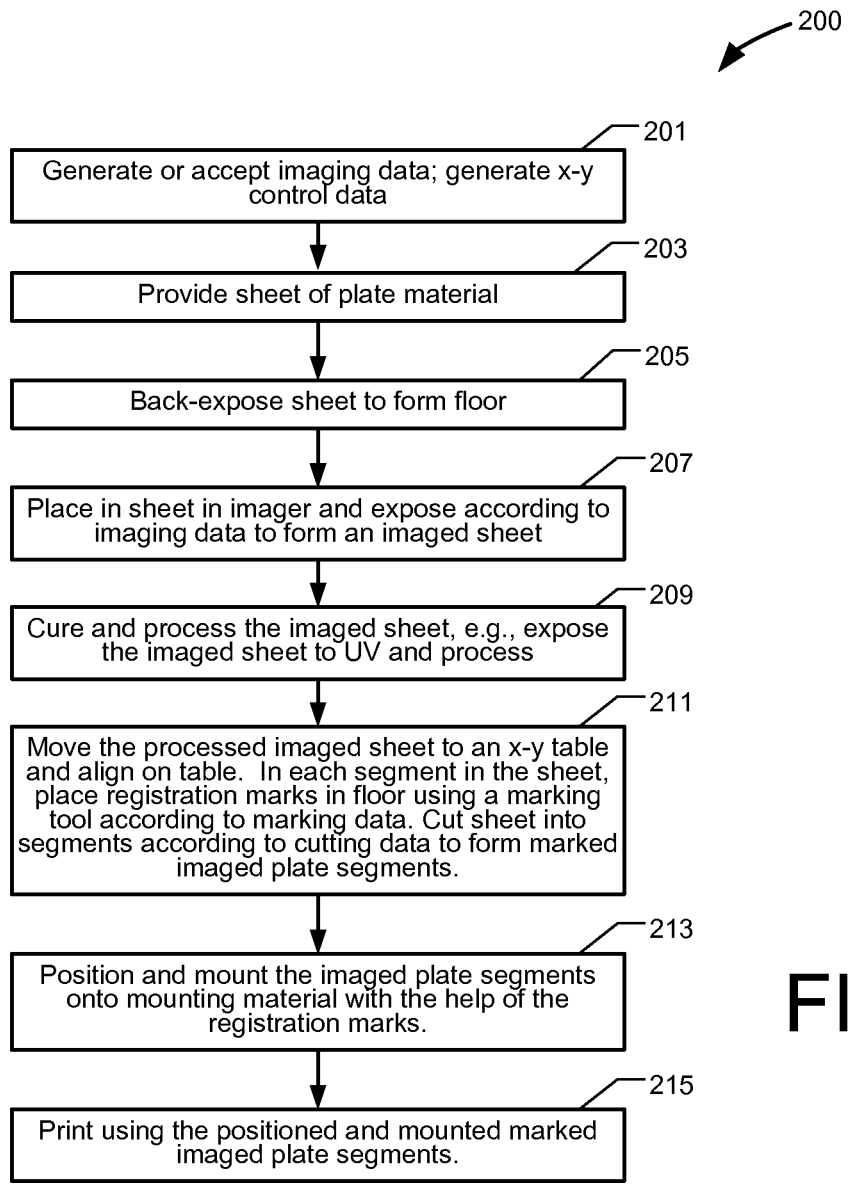
FIG. 2 shows a simplified flowchart of an example method embodiment of producing a mounted plate suitable for printing using the example workflow of FIG. 1.

FIG. 1 shows the elements of an example workflow for producing one or more plate segments placed for printing, such a workflow including aspects of the present invention. FIG. 2 shows a simplified flowchart of an example method embodiment of producing a mounted plate suitable for printing using such a workflow. The workflow shown in for direct-to-plate imaging of a sheet having an ablatable material thereon. The workflow for using a separate is not that different, and any differences will be described herein below.

The following refers to the workflow of FIG. 1 and the flowchart of FIG. 2.

A processing system 131, e.g., a computer workstation having one or more processors, and a storage subsystem, is used. In some embodiments, the processing system used may include several computer systems, e.g., several computer systems that are coupled by a network, but for the sake of simplicity is shown as a single set of elements. The processing system 131 includes a user interface that includes a display device for presenting information to a user, and one or more data entry devices to accept data from the user. The storage subsystem includes instructions that when executed by at least one of the processors generates imaging data 121, marking data 125, cutting data 123, and mounting data 127, all having a common frame of reference. In one embodiment, the imaging data 121, marking data 125, cutting data 123, and mounting data 127 are formed from design data regarding the design to be printed. For example, in the case of printing a design that includes many unprinted areas, and printing elements in other areas, in order to save plate material, the design is analyzed to form imaging elements that are placed close together in the imaging data to make up plate elements—patches—that after imaging and washing, are cut according to the cutting data 123 and then positioned and mounted according the mounting data 127 to correctly place plate segments corresponding to the printing elements on mounting material.

In existing workflows, the generating of imaging data includes adding registration mark data to place registration marks outside the design area of each segment. Such registration marks are placed outside the design area so that the registration marks do not produce undesired printed marks on prints produced by the mounted segments. The registration marks are used with the mounting data to correctly place each segment.

One aspect of the invention is generating of marking data that is used to place registration marks on each segment that can be within the design area in that such registration marks do not cause visible marks in a print made from the segment.

The printing data is used by an imager 133. In the version shown in FIG. 1, the imager is assumed to be for direct-to-plate printing on sheets that have an ablatable mask material thereon. In the case of non-direct-to-plate imaging, the imager exposes a mask, e.g., a photographic mask.

The workflow also includes a UV exposer and washer 135 that is used to cure the sheet with a mask thereon by exposing the front of the plate with the mask thereon to UV radiation. In the case of direct-to-plate imaging, the sheet of plate material (after back-radiation) is imaged on the imager. In the case of non-direct-to-plate imaging, the UV exposer and washer 135 includes a mechanism to place a mask on the front of the plate prior to exposure, and it is the mask that comes from the imager and placed with the sheet of plate material after back-exposure.

Some embodiments include an x-y table 137 that includes a tool holder 139 whose operation is controlled according to x-y control data. In some embodiments, the x-y table can operate one of a set of tools in the tool holder 139 under control of the x-y control data, including selecting a tool of the set. As an example, one tool of the set is a cutting tool, and in some embodiments, the x-y table 137 is operative to cut segments from a sheet placed on the table according to x-y control data that includes the cutting data 123. The x-y table 137 includes a laser positioning tool and in some embodiments, one or more video cameras. The positioning tool or the video cameras or both are used to accurately register the position of a sheet of plate material placed on the x-y table. In some embodiments, for example, the imaging data includes a pair of registration marks that exposed to produce a pair of visible registration marks on the sheet. By registering to the registration marks on the sheet, the imaging data 121 and any x-y control data, e.g., x-y control data that includes the marking data 125 for marking with a marking tool, and marking data 123 for cutting with a cutting tool can all have the same frame of reference on the surface of the sheet when placed on the x-y table 137. The x-y table 137 in one embodiment is configured to cut the sheet into imaged plate elements using the cutting tool of tool set 139 according to cutting data.

In some embodiments of the invention, the x-y table 137 is also configured to place registration marks on each segment according to the marking data 125. In such a case, the marking data is included in the x-y control data. The set of tools 139 includes a marking tool, which depending of the embodiment, can be laser tool, a knife tool, a drill tool, or a pen tool. The marking data 125 can include instructions as to which of the marking tool to use. One aspect of the invention is generating of marking data 125, e.g., as part of the x-y control data that is used to place registration marks on each segment that can be within the design area, in that such registration marks do not cause visible marks in a print made from the segment.

In some embodiments, the marking data includes identification data to enable identification of the segments, e.g., as belonging to a particular job.

Note that while the embodiment shown in FIG. 1 shows a controllable x-y table used for both marking the registration marks on the one or more segments, and for cutting the segments from the sheet, the invention is not limited to such an arrangement. Any controllable marking device can be used for the marking, and for workflows that include the cutting, any controllable cutting device can be used for the cutting. The marking device can be a separate device from the cutting device. Thus, for example, a controllable plotter, not necessarily a flat x-y table, may be used for the marking according to the marking data.

Some embodiments include a mounting device 141 that is used for mounting imaged segments onto mounting material, e.g. a sleeve or other mounting material. The mounting device 141 is controlled by mounting data. The mounting device includes a positioning registration subsystem that includes one or both of a laser positioning tool and a set of one or more video cameras used to accurately register the position of imaged segments according to the registration marks thereon so that the segments can be accurately placed on the mounting material according to the mounting data.

Some embodiments further include a printing press 143. The mounting material with the imaged plate segments thereon, e.g., the sleeve with the plate segments thereon are placed on the printing press and prints made.

In some workflows, the one or more plate segments are mounted directly on a drum or press cylinder for use in printing.

FIG. 2 shows a simplified flowchart of a method 200 of preparing one or more plate segments, and mounting these on mounting material for printing, as reflected by the workflow shown in FIG. 1. Referring to FIGS. 1 and 2, 201 includes generating imaging data 121, x-y control data including marking data 125 and cutting data 123, and mounting data 127 according to the design desired. Such generating is part of an interactive design process carried out in the workstation processing system 131. The imaging data 121, marking data 125 and cutting data 123 are in the form of digital files stored in the processing system 131. 203 includes providing a sheet of plate material. 205 includes back-exposing the sheet to form a floor on the sheet. The resulting unimaged sheet after back-exposure shown as 103 in FIG. 1. In 207, the unimaged sheet 103 is placed in imager 133, and exposed according to imaging data 121 generated in the workstation processing system 131. In 209, the sheet after imaging is exposed via the imaged mask material on the sheet material, and the sheet after UV exposure is processed. This forms an imaged sheet 105 that includes one or more segments, each having a design area defined by imaging data 121. As described above, the imaging data 121 also includes registration marks for the sheet. 211 includes moving the processed imaged sheet 105 to x-y table 137 and aligning the sheet 105 on the x-y table 137. For each segment in the sheet, 211 includes marking registration marks in the floor of the plate using a marking tool on tool holder 139 according to marking data 125 that is also generated in the workstation processing system 131. 211 also includes cutting the sheet 105 into one or more segments using a cutting tool in tool holder 139 according to marking data 123 also generated in the workstation processing system 131. This forms one or more marked imaged plate segments 107. 213 includes positioning and mounting the marked imaged plate segments 107 onto mounting material e.g., in mounting device 141 according to mounting data, using the registration marks for alignment. Suppose, for example, that the plate segments are mounted onto an imaging sleeve. 213 results in a sleeve 109 with mounted segments ready for use in printing. 215 includes using the positioned and mounted marked imaged plate segments, e.g., the sleeve 109 with the segments mounted thereon to print.

The marking in 211 produces one or more registration marks that can be within the design area of each imaged segment. The marking in 211 furthermore, is such that the one or more registration marks are not visible on a print made from the one or more imaged plate segments 107.

In the workflow described in FIG. 2, the marking is on the floor of each plate segment, so that the registration marks do not print. In an alternate embodiment, the marking is on the back of each plate segment. In such an alternate embodiment, the imaged sheet 105 is flipped over onto the surface of the x-y table 137 with the back of the plate facing up in order to mark the plate segments with registration marks on the back of the plate according to marking data 125, and to cut into individual segments for mounting on a sheet, sleeve or drum according to cutting data 123. Such a workflow is operable, for example, for plate material that after imaging and processing, is transparent or translucent with sufficient transparency such that any registration marks marked on the back of the plate segment or segments are visible from the front of the plate or plate segments sufficient to accurately mount on the mounting material using the positioning registration subsystem, e.g., a laser positioning tool or one or more video cameras of mounting device 141.

In yet another variation, the sheet prior to back-exposure is placed on an x-y table. The marking of the registration marks onto the one or more plate segments includes placing masking material as registration marks onto the back of the sheet prior to back exposure according to marking data provided from the processing system 131. This marking is carried out using a marking tool that places an amount of UV blocking ink on the back to mark the registration marks. One such alternate workflow includes placing a pair of registration marks for the whole sheet on the back in the form of UV blocking ink prior to back exposure. The UV blocking ink could prevent curing of the plate material during back-exposure, resulting in hollow registration marks within the floor. The remainder of the workflow is similar. The x-y table can be the same or a different x-y table than used for cutting. The placing of the sheet registration marks enables the imaging data, marking data, cutting data, and mounting data to all be used with a common frame of reference.

Thus, registration marks for registration/mounting purposes are produced on one or more plate segments which are on the floor of the printing surface or on the back of the plate. The floor of the printing surface is commonly understood to be a surface that is below the printing surface. The registration marks are below the printing surface and can therefore be positioned anywhere in or around the design area. The freedom of positioning registration marks can lead to high plate material and labor savings.

The marking of the registration marks on the one or more segments can occur in different ways in different embodiments of the invention. In some embodiments, the registration marks are made by a cutting tool, in another by a pen tool. In yet another, the registration marks are made to possibly be printable during imaging, and in a marking step, using a laser tool, the top part of the marks are removed by a laser to make the registration mark visible for aligning and mounting purposes, but low enough below the surface so that these registration marks will not print. This removal is also known as "undercut".

Note that according to aspects of the present invention, the placing of the registration marks to not be printable, e.g., in the design area by placing the mark in the back of the plate, or on the floor, is part of an automated workflow that includes having the registration mark location in marking data, e.g., as design commands as part of x-y control data, e.g., in a design file and having the placement be part of an automated process, with the resulting plates re-usable. This therefore differentiates such embodiments with a method that includes placing registration marks within the design area, and then once the registration marks are used for plate placement and prior to using the plates, manually removing the registration marks, e.g., by manually cutting away the marks on the mounted plates to avoid printing. Such a method would involve a manual step and further results in a plate that is not re-usable, e.g., not re-usable for additional repeated mounting/printing cycles. Such embodiments of the invention also are differentiated such from a method that includes a plate operator manually drilling registration and/or mounting marks, e.g., using a video-driven drill. This requires a high accuracy manual step which typically is labor intensive.

FIG. 3A shows a simple example of a design in a design area 303 on a desired print. The printing portions of the design include black printing parts shown in solid black, and cyan printing parts shown in as hatched areas. In one embodiment, the software operating on the workstation processing system determines from imaging data of a whole sheet a border 305 that will become plate segments of each of the different color inks Although in this example, the different color inks to print this design area have the same borders, in general the plate segments for each color ink can be made up of different segments, e.g., a different number of different segments of different respective sizes.

Continuing with the example, FIGS. 3B and 3C show two marked imaged plate segments 311 and 321, respectively, used to create sleeves for printing in black and cyan, respectively. Segment 311 includes portions that are to be printed, as well as registration marks 313 and reference information 315 that is marked on the floor of the plate segment according to embodiments of the present invention, such that the registration marks 313 and reference information 315 will not be visible on a print of the design area 303. Similarly, Segment 321 includes portions that are to be printed, as well as registration marks 323 and reference information 325 that is marked on the floor of the plate segment according to embodiments of the present invention, such that the registration marks 323 and reference information 325 will not be visible on a print of the design area 303.

Note that the elements, such as the registration marks 313, 323 and reference information 315, 325 are not shown to scale in the drawings. Note also that while crosses are shown in FIGS. 3A and 3B, the invention is not limited to any particular shape of the registration marks. Such marks can be crosses, dots, micro-shapes or any other indicia that are usable for the purpose of mounting accurately.

Figure 4A:
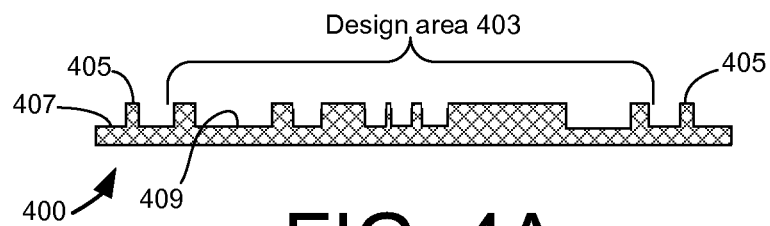
FIG. 4A shows a simplified example of the cross-section a prior art plate segment with a design area on which there is a printing pattern.

FIG. 4A shows a simplified example of the cross-section of a prior art plate segment 400 with a design area 403 on which there is a printing pattern, and registration marks 405 in the form of printing parts 405 outside the design area. The cross-section shown through the printing parts that form the registration marks. FIG. 4A shows as 407 one of the floor areas that is outside the design area, and a floor area 409 that is within the design area. In order to accommodate the registration marks, and because the registration marks would form visible marks on a print, the size of the plate segment 400 is larger than the design area 403.

Figure 4B:
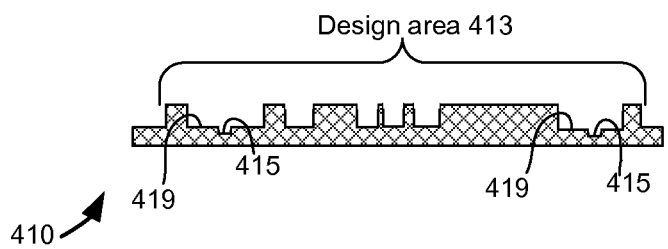
FIGS. 4B and 4C each shows a simplified example of a cross-section a plate segment with a design area which is the same size as that of the plate segment of FIG. 4A. The segment of FIG. 4B includes registration marks produced according to one embodiment of the invention, and the segment of FIG. 4C includes registration marks produced according to one embodiment of the invention.

FIG. 4B shows a simplified example of the cross-section a plate segment 410 with a design area 413 which is the same size as that of the plate segment of FIG. 4A. The floor areas 419 that are within the design area 413 include registration marks 415 that are marked on the floor areas using a marking tool according to an embodiment of the present invention. The registration marks, being marked on the floor, will not print. Hence, the plate segment 410 can be smaller than the plate segment 400, even though they both have design areas that are of the same size.

Figure 4C:
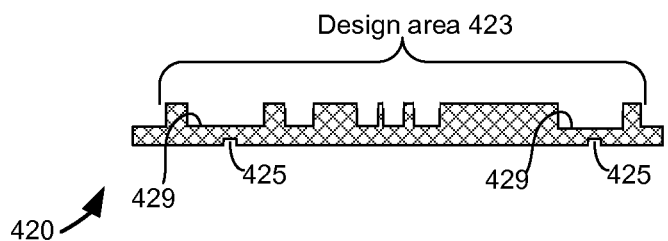

FIG. 4C shows a simplified example of the cross-section a plate segment 420 with a design area 423 which is the same size as that of the plate segment of FIG. 4A. The floor areas 429 that are within the design area 423 include registration marks 425 that are marked on the back of the plate segment according to an alternate embodiment of the present invention. The registration marks, being marked on the back of the plate, will not print. Hence, the plate segment 420 can be smaller than the plate segment 400, even though they both have design areas that are of the same size.

One aspect of the invention is the automatic reduction of the size of plate segments. In some workflows, the imaging data already includes registration marks for the various segments. For example, for a 4-color job, the imaging data for each color includes the registration marks. In one prior art workflow, these registration marks on the plate might be drilled out on the imaged plates to produce marks suitable for use in mounting.

Figures 6A, 6B:
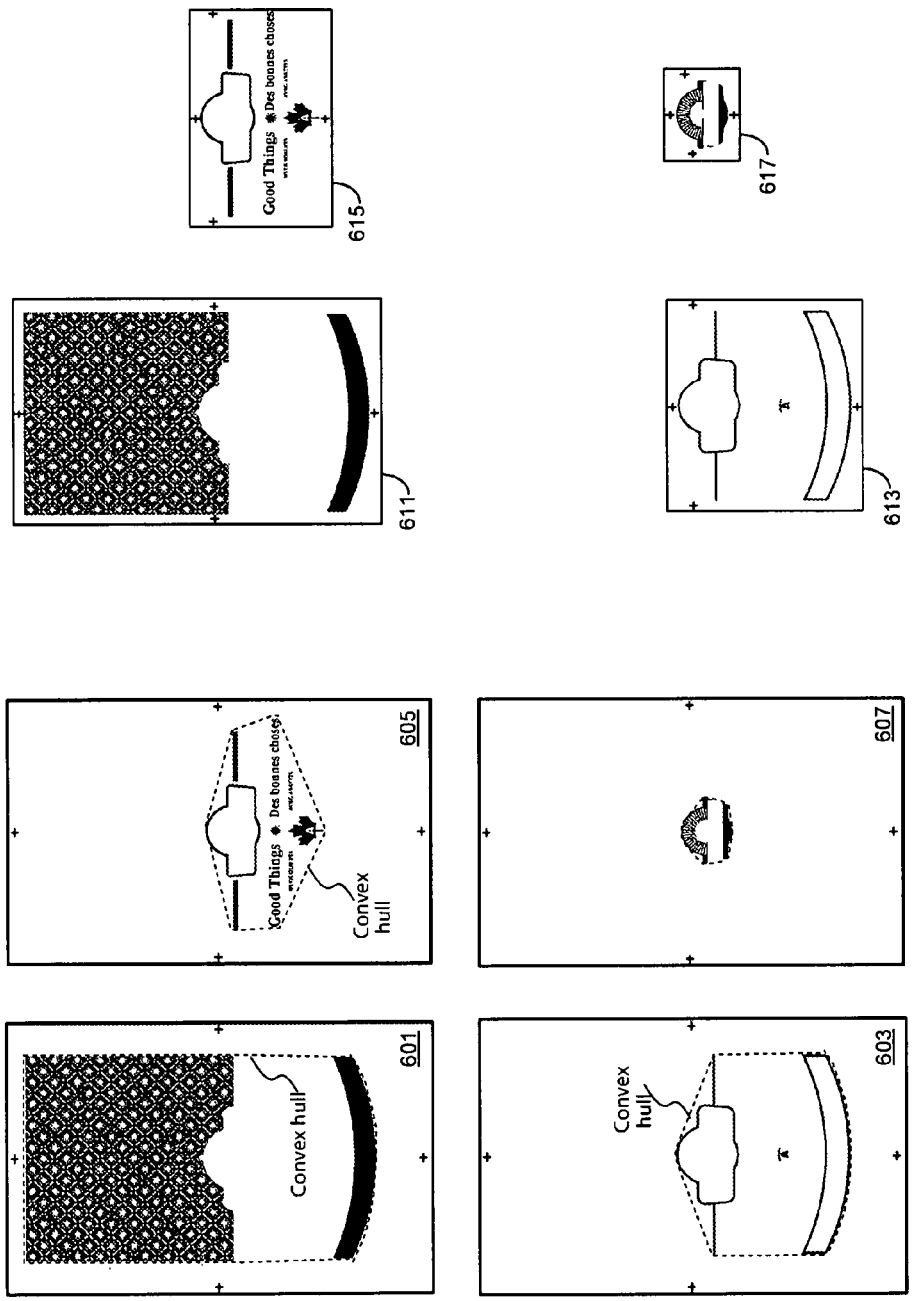
FIG. 6A shows a set of four images that are used to produce plate segments.
FIG. 6B shows in visual form a corresponding set of data for four plate segments that are reduced in size, and that each include determined registration mark locations at which are placed registration marks on the floor or back of the respective plate segment according to a feature of embodiments of the present invention.

FIG. 6A show a set of four images that are used to produce plate segments. The respective imaging data 601, 603, 605, and 607 of each respective plate includes registration marks in the printing data. FIG. 6B shows a corresponding set of data for four plate segments 611, 613, 615, and 617, respectively, that are reduced in size, and that each includes determined registration mark locations at which are placed registration marks on the floor or back of the respective plate segment according to a feature of embodiments of the present invention. As is clear, the four plate segments 611, 613, 615, and 617 are significantly smaller than 601, 603, 605, and 607, leading to savings in plate material. Shown on FIG. 6A are the convex hulls of the respective images, each convex hull defining a design area of the respective image.

One aspect of the present invention is the automatic determination of the size of such reduced plate segments, and of determining the location of the registration marks to be marked on the floor or back of each reduced size plate section.

One embodiment of the method for any single plate section includes accepting imaging data that includes a design area with image elements thereon, and registration marks. The method includes determining the location of the registration marks, determining the size of a bounding box of the set of image elements as if the imaging data did not include the registration marks. The method further includes moving the location of each registration mark vertically or horizontally from the determined location towards the nearest boundary of the bounding box to define new registration mark locations adjacent to the bounding box, and defining as the plate segment boundary the smallest border that includes the bounding box and the new registration mark locations.

Figure 7B:
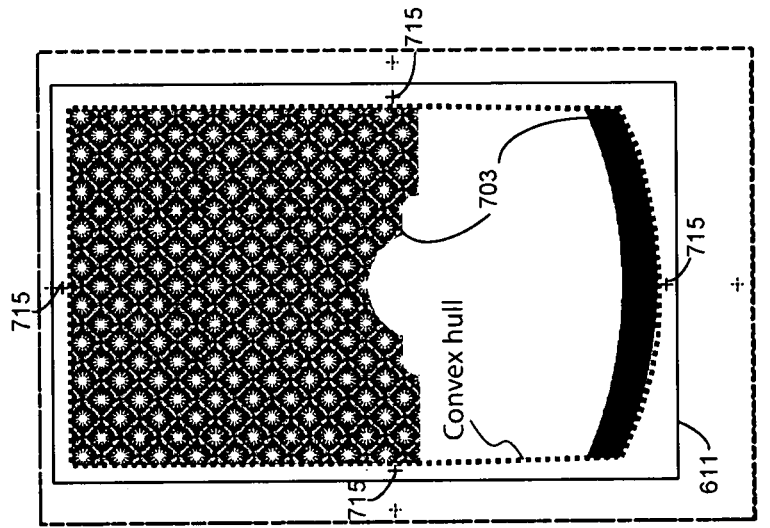
FIGS. 7B, 8B, 9B, and 10B show the segments shown in FIG. 6B in more detail.
Figure 7A:
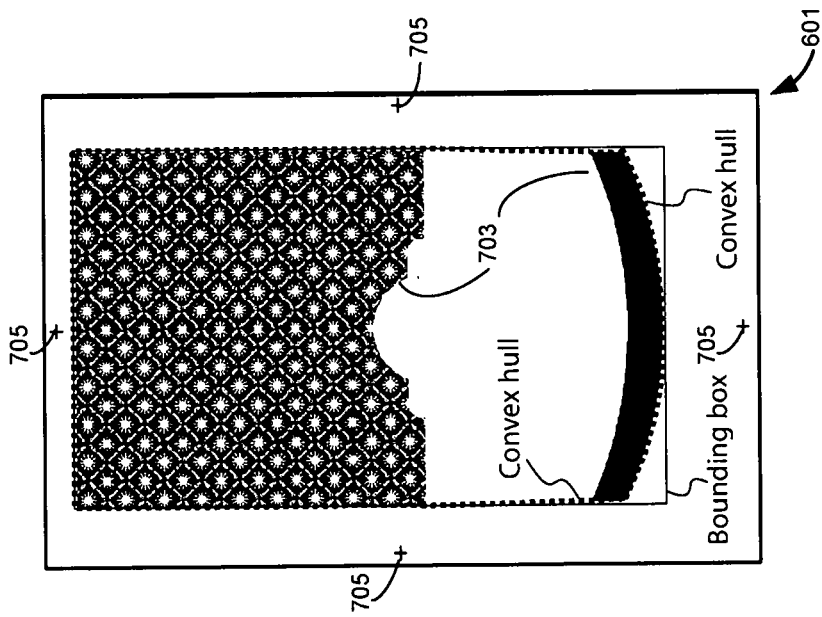

FIG. 7A shows the imaging data 601 for a conventional plate segment in more detail. The imaging data includes image elements 703 and four registration marks 705. FIG. 7B shows the result of the method operating on the imaging data of the plate section 601 to move the location of the registration marks and the cutting pattern for cutting the resulting plate segments. The old cutting pattern and registration mark locations are shown by dotted lines. The bounding box that covers the image elements 703 is determined, and enlarged sufficient to include the four registration marks, and thus form the cutting pattern shown as 611 to be included in the cutting data. Also shown in FIG. 7A is the convex hull of the shape that defines the design area for that shape. Each registration mark is moved towards the determined bounding box to be just inside the enlarged bounding box. The new registration mark positions are shown as 715. These form the marking data for this segment.

Figure 8B:
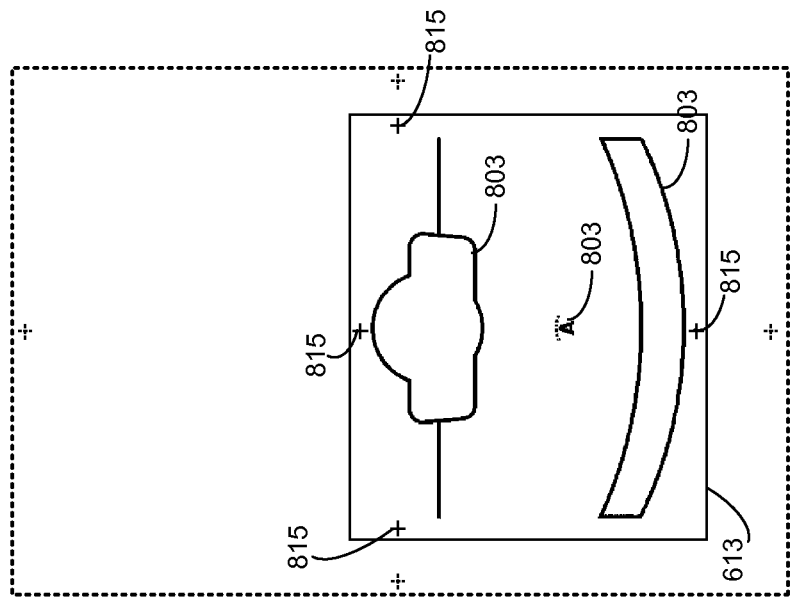
Figure 8A:
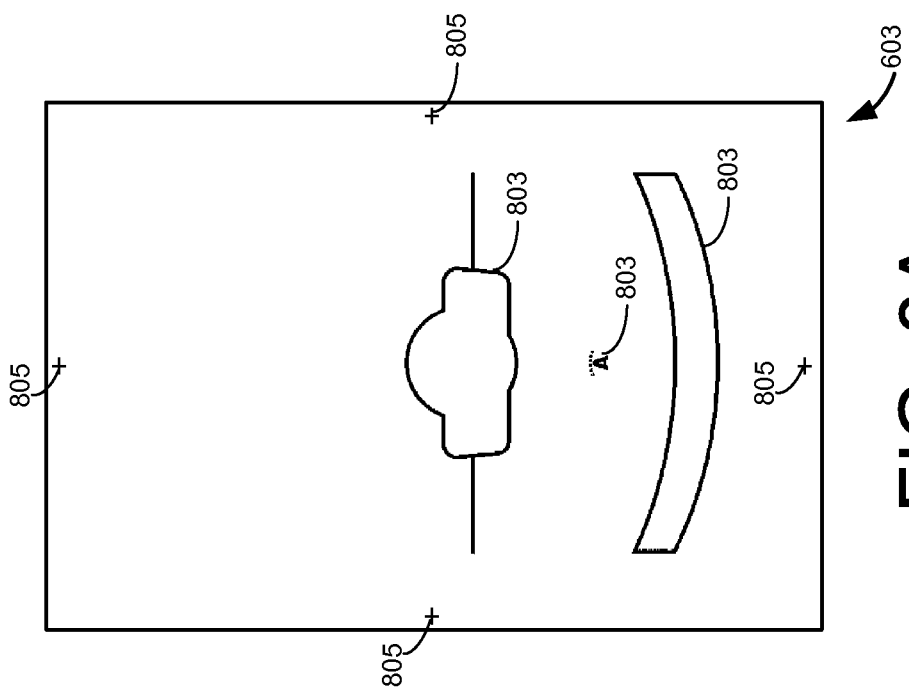

FIG. 8A similarly shows the imaging data 603 for a conventional plate segment in more detail. The imaging data includes image elements 803 and four registration marks 805. FIG. 8B similarly shows the result of the method operating on the imaging data of the plate section 601 to move the location of the registration marks and the cutting pattern for cutting the resulting plate segments. The old cutting pattern and registration mark locations similarly are shown by dotted lines. The bounding box that covers the image elements 803 is determined, and enlarged sufficient to include the four registration marks, and thus form the cutting pattern shown as 613 be included in the cutting data. Each registration mark is moved towards the determined bounding box to be just inside the enlarged bounding box. The new registration mark positions are shown as 815. These form the marking data for this segment.

Figure 9B:
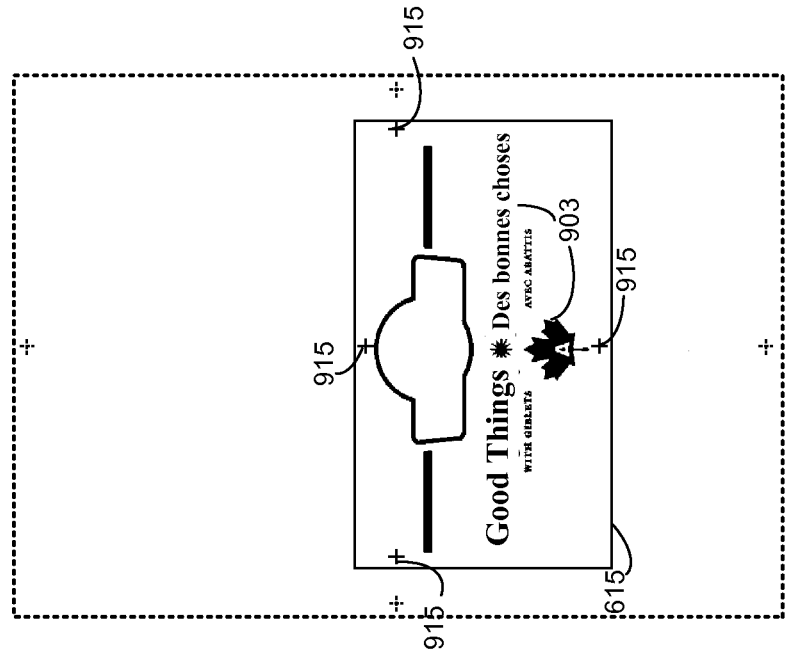
Figure 9A:
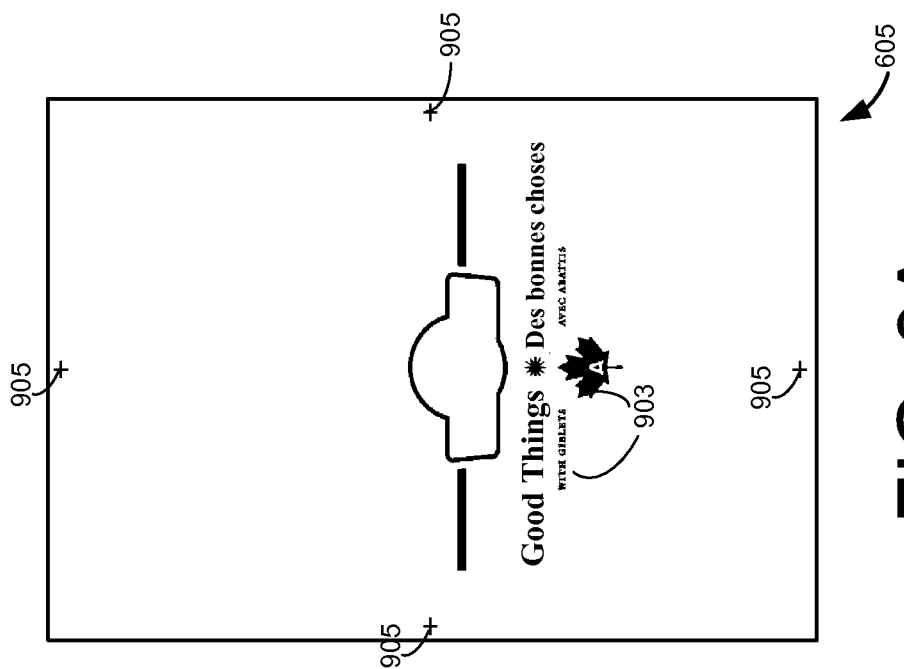

FIG. 9A similarly shows the imaging data 605 for a conventional plate segment in more detail. The imaging data includes image elements 903 and four registration marks 905. FIG. 9B similarly shows the result of the method operating on the imaging data of the plate section 601 to move the location of the registration marks and the cutting pattern for cutting the resulting plate segments. The old cutting pattern and registration mark locations similarly are shown by dotted lines. The bounding box that covers the image elements 903 is determined, and enlarged sufficient to include the four registration marks, and thus form the cutting pattern shown as 615 to be included in the cutting data. Each registration mark is moved towards the determined bounding box to be just inside the enlarged bounding box. The new registration mark positions are shown as 915. These form the marking data for this segment.

Figure 10B:
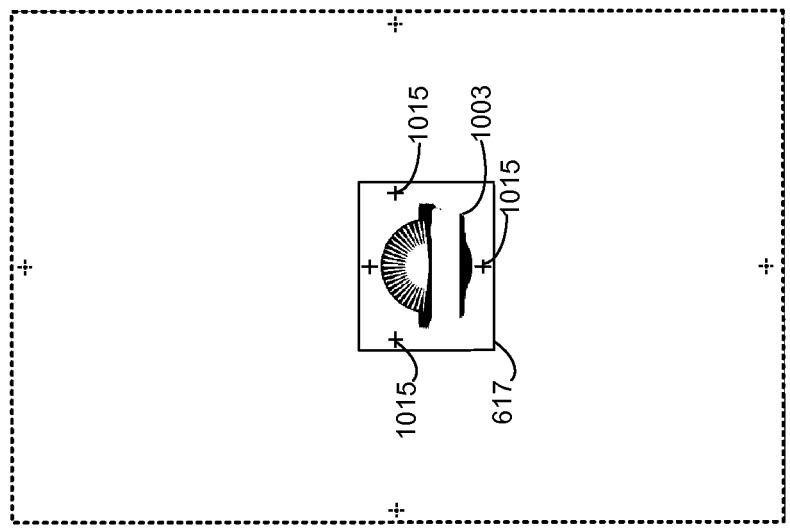
Figure 10A:
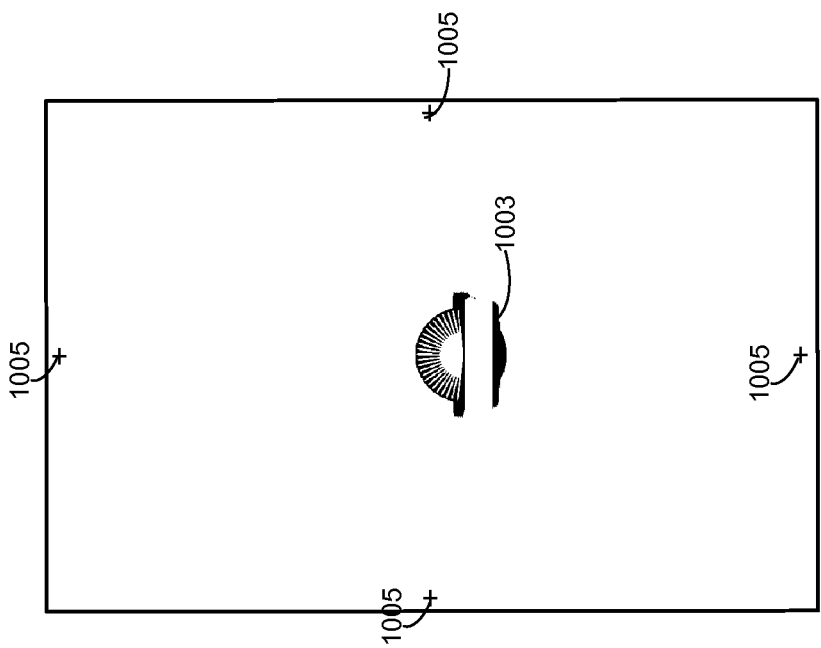

FIG. 10A similarly shows the imaging data 607 for a conventional plate segment in more detail. The imaging data includes image elements 1003 and four registration marks

1005. FIG. 10B similarly shows the result of the method operating on the imaging data of the plate section 601 to move the location of the registration marks and the cutting pattern for cutting the resulting plate segments. The old cutting pattern and registration mark locations similarly are shown by dotted lines. The bounding box that covers the image elements 1003 is determined, and enlarged sufficient to include the four registration marks, and thus form the cutting pattern shown as 617 to be included in the cutting data. Each registration mark is moved towards the determined bounding box to be just inside the enlarged bounding box. The new registration mark positions are shown as 1015. These form the marking data for this segment.

It some embodiments, the registration marks are all moved simultaneously through all colors to avoid moving the cameras of the mounting machine when mounting one color after the other of the same job.

Embodiments of the invention include a printing plate segment made by any of the methods described herein that include marking the floor of the printing plate segment or the back of the printing plate segment with one or more registration marks according to marking data. The plate segment includes a design that is defined by imaging data. The one or more registration marks can be within the design area. The marking is such that the one or more registration marks are not visible on a print made from the printing plate segment.

Some embodiments of the invention are in the form of software that determines the imaging data, marking data, cutting data in embodiments that include cutting, and mounting data in embodiments that include mounting using a mounting device according to mounting data. The software is made up of instructions that when executed by one or more processors of a processing system cause carrying out of the method that determines the imaging data, marking data, cutting data in embodiments that include cutting, and mounting data in embodiments, and furthermore, that controls the workflow as described in example embodiments herein above and shown as exampled in FIG. 1 and FIG. 2. The instructions are stored in a tangible computer readable storage medium, such as a magnetic medium, e.g. a hard disk, or in an optical medium, e.g., a CD or a DVD, or in a solid state memory.

Thus, in some embodiments, a computer-readable storage medium is configured with, e.g., encoded with instructions that when executed by one or more processors of a processing system e.g., a workstation that includes at least one processor element and a storage subsystem, cause carrying out a method as described herein.

Figure 5:
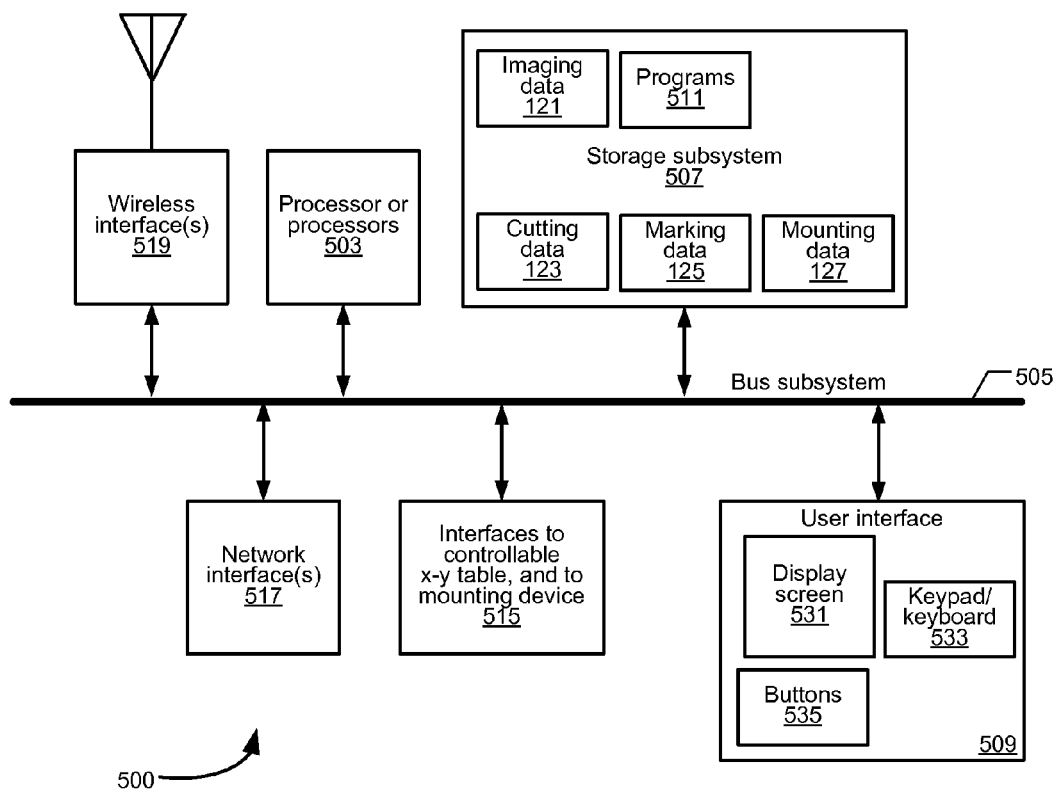
FIG. 5 shows one example of a processing system that can be used as the workstation of FIG. 1 and that includes a computer-readable storage medium in which are stored instructions that when executed cause an embodiment of the invention to be carried out.

The methodologies described herein are, in some embodiments, performable by one or more processors that accept logic, instructions encoded on one or more computer-readable media. When executed by one or more of the processors, the instructions cause carrying out of at least one of the methods described herein. Any processor capable of executing a set of instructions (sequential or otherwise) that specify actions to be taken are included. Thus, one example is a typical processing system that includes one or more processors. FIG. 5 shows one example of a processing system 500 that can be used as the workstation 131 of FIG. 1, marked in FIG. 1 as "Workstation—processing system (Design system and controller)." The processing system includes one or more processors 503. Each processor may include one or more of a CPU or similar element, a graphics processing unit (GPU), and/or a programmable DSP unit. The processing system further includes a storage subsystem 507 with at least one storage medium, which may include memory embedded in a semiconductor device, or a separate memory subsystem including main RAM and/or static RAM, and/or ROM, and also cache memory. The storage subsystem may further include one or more other storage devices, such as magnetic and/or optical and/or further solid state storage devices. A bus subsystem 505 may be included for communicating between the components. Although typically complex, the bus subsystem is shown in FIG. 5 as a single bus. The processing system further may be a distributed processing system with processors coupled by a network, e.g., via network interface 517 or wireless network interface 519. The processing system includes a user interface 509 that in one embodiment includes a display screen 531, a keyboard 533, and a pointing device. In one embodiment, the user interface includes buttons 535, either in hardware form, as a so-called soft buttons that are displayed on the display screen and can be interacted with by a user. The display screen may be, e.g., a liquid crystal display (LCD), organic light emitting display (OLED), or a cathode ray tube (CRT) display. The term storage device, storage subsystem, or memory unit as used herein, if clear from the context and unless explicitly stated otherwise, also encompasses a storage system such as a disk drive unit.

The storage subsystem thus includes a tangible computer-readable medium that is configured with, e.g., encoded with instructions, e.g., logic, e.g., software programs 511 that when executed by one or more of the processors, causes carrying out one of more of the method steps described herein. The software may reside in the hard disk, or may also reside, completely or at least partially, within the RAM and/or within the processor during execution thereof by the computer system. Thus, the memory and the storage elements with the processor also constitute computer-readable medium on which are encoded instructions.

The processing system in some embodiments further includes one or more interfaces 515 to the controllable x-y table 137, and to the mounting device 141.

Note that while some diagram(s) only show(s) a single processor and a single storage subsystem, e.g., a single memory that stores the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Unless specifically stated otherwise, as apparent from the following description, it is appreciated that throughout the specification discussions utilizing terms such as "processing," "computing," "calculating," "determining" or the like, refer to the action and/or processes of a computer or computing system, or similar electronic computing device, that manipulate and/or transforms data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps is implied, unless specifically stated.

While the computer readable medium is shown in an example embodiment to be a single medium, the term "medium" should be taken to include a single medium or multiple media (e.g., several memories, a centralized or distributed database, and/or associated caches and servers) that store the one or more sets of instructions.

It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill skilled in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patents, U.S. patent applications, and International (PCT) patent applications designating the United States cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of creating a printing plate that includes a plurality of plate segments, the method comprising:
    creating each of the plurality of plate segments, each plate segment comprising one or more registration marks, and
    positioning and mounting the created plate segments on mounting material using the one or more registration marks to aid the positioning,
    wherein creating each of the printing plate segments comprises:

providing a prior-to-imaging printing plate segment made of a printing plate material, the prior-to-imaging plate segment having a front and a back, and a to-be-imaged surface on the front;

imaging and processing the provided plate segment by exposing the front of the plate segment with imaging data and processing the exposed plate segment to form an imaged plate segment made of the printing plate material and having a front surface on the front and a back surface on the back, the front surface including a printing surface and a floor below the printing surface, each of the printing surface and the floor being defined on and an integral part of the imaged plate segment, and made of the same one printing plate material, such that the printing surface of the imaged plate segment corresponds to regions that would be visible, and the floor of the imaged plate segment corresponds to regions that would not be visible on a print made with the imaged plate segment, the convex hull of the regions of the printing surface that would be visible defining a design area on the front surface of the imaged plate segment; and marking one or more registration marks on the printing plate segment below the printing surface that is formed by the imaging and processing, the marking being according to marking data, the marking producing, after the imaging and processing, a marked imaged plate segment of the one printing plate material with registration marks thereon below the printing surface thereof, such that one or more registration marks may be placed within the design area, and such that no matter whether the one or more registration marks that are on the marked imaged plate segment are within the design area or outside the design area, the one or more registration marks are not visible on a print made using the marked imaged plate segment, such that printing using the positioned and mounted marked imaged plate segments produces a print without the registration marks of each of the segments visible on the print, and wherein each marked imaged plate segment is reusable after the printing.

2. The method as recited in claim 1, wherein the marking is carried out on the imaged plate segment after the imaging.

3. The method as recited in claim 1, wherein the marking is carried out on the printing plate segment prior to the exposing.

4. The method as recited in claim 1, wherein the marking is on the floor of the imaged plate segment.

5. The method as recited in claim 1, wherein the marking is on the back of the plate segment.

6. The method as recited in claim 1, wherein the marking is carried out automatically on an x-y table using a marking tool controlled by marking data after moving the plate segment to the x-y table.

7. The method as recited in claim 6, wherein the marking tool is one of the set of tools consisting of a laser tool, a knife tool, a drill tool, and a pen tool.

8. A method carried out on a processing system to create data for a workflow in order to form one or more marked imaged plate segments, the method comprising:

for each of one or more plate segments:
accepting by the processing system imaging data for printing said each plate segment, the plate segment being made of a printing plate material and having a front and a back, with a to-be-imaged surface on the front, the respective imaging data for said each plate segment including respective image elements defining a respective design area for said each plate segment;

determining respective marking data for one or more respective registration marks for marking said each plate segment, the determining being from the accepted imaging data, the respective marking data for said each plate segment being for marking the plate segment with one or more respective registration marks, wherein imaging and processing of said each plate segment forms a respective imaged plate segment having a front surface on the front of said each plate segment and a back surface on the back of the plate segment, the front surface including a printing surface and a floor below the printing surface, the printing surface and the floor being defined on and an integral part of the respective imaged plate segment, and made of the same one printing plate material, such that the printing surface of the respective imaged plate segment corresponds to regions that would be visible, and the floor of the respective imaged plate segment corresponds to regions that would not be visible on a print made with the respective imaged plate segment, the convex hull of the regions of the printing surface that would be visible defining a design area on the front surface of the respective imaged plate segment, wherein the marking of said each plate segment marks the respective one or more registration marks below the respective printing surface that is formed by the printing and imaging, the marking being according to the respective determined marking data, such that no matter whether the one or more registration marks for said each plate segment are within or outside the respective design area, the one or more respective registration marks are not visible on a print made from the respective imaged plate segment; and accepting or determining respective cutting data for cutting said each plate segment, the determining of the respective cutting data being from the respective imaging data for said each plate segment, the cutting data for use in the workflow;

wherein the workflow comprises:
providing a sheet of printing plate material, the sheet having a plate back and a plate front, with the to-be-imaged surface on the plate front;

placing the sheet of printing plate material in an imager, exposing the plate front of the sheet to a respective portion of the imaging data for imaging of a respective plate segment, the portion including the respective design area of the respective plate segment, and processing the sheet to form an imaged sheet that includes a set of one or more imaged plate segments;

for each respective plate segment on the sheet, marking the respective plate segment with one or more registration marks according to the respective marking data, the marking, the imaging, and the exposing producing one or more marked imaged plate segments on the sheet, the marking placing the one or more registration marks on the printing plate segment below the respective printing surface, such that no matter whether the one or more registration marks that are on the marked imaged plate segment are within or outside the respective design area, the one or more registration marks are not visible on a print made from the marked imaged plate segment;

cutting the sheet into segments according to the cutting data to form cut marked imaged plate segments made of the printing plate material and having respective front and back surfaces, the respective printing surfaces being on the respective front surfaces;

positioning and mounting the cut marked imaged plate segment on mounting material, using the one or more registration marks to aid the positioning, to form one or more positioned and mounted marked imaged plate segments for printing, such that printing using the positioned and mounted marked imaged plate segment produces a print without the registration marks visible on the print, and wherein the mounted cut marked imaged plate segments are reusable after the printing by unmounting, repositioning, and remounting at least one of the cut marked imaged plate segment with the registration marks thereon to form a newly mounted marked imaged plate segment.

9. The method as recited in claim 8, wherein the marking is on each of the set of imaged plate segment after the exposing.

10. The method as recited in claim 8, wherein the marking is on each of the set of at least one of the plate segments prior to the exposing to imaging data.

11. The method as recited in claim 8, wherein the marking is on the floor of each imaged plate segment.

12. The method as recited in claim 8, wherein the marking is on the back of each plate segment.

13. The method as recited in claim 8, wherein the marking is carried out automatically on an x-y table using a marking tool controlled by the marking data after moving the sheet to the x-y table.

14. The method as recited in claim 13, wherein the marking tool is one of the set of tools consisting of a laser tool, a knife tool, a drill tool, and a pen tool.

15. A method of preparing one or more printing plate segments for mounting on mounting material, the method comprising:

forming marking data for controlling a marking device to mark one or more registration marks on each of the one or more printing plate segments, the printing plate segments being made of a printing plate material and having respective fronts and backs, the forming using imaging data, the imaging data for imaging each of the printing plate segments by exposing said each printing plate segment with at least a portion of the imaging data and by processing each exposed printing plate segment to form a respective imaged plate segment made of the printing plate material and having a front surface on the respective front and a back surface on the respective back, the front surface of said each imaged printing plate segment including a respective printing surface and a respective floor, each of the printing surface and the floor being defined on and an integral part of the said each imaged plate segment, and made of the same one printing plate material, such that the printing surface of the respective imaged plate segment corresponds to regions that would be visible and the floor of the imaged plate segment corresponds to regions that would not be visible on a print made with the imaged printing plate segment, wherein the convex hull of the regions of the printing surface that would be visible define a respective design area on the front surface of the respective imaged plate segment, and wherein the marking device is for marking respective one or more registration marks on the respective printing plate segment below the printing surface of each respective plate segment according to the respective marking data, such that no matter whether the one or more registration marks on a segment are within or outside the design area of the segment, the one or more registration marks are not visible on a print made using the respective one or more printing plate segments;

providing a sheet of the printing plate material, the sheet having a plate back and a plate front, with the to-be-imaged surface on the plate front;

placing the sheet of printing plate material in an imager, exposing the plate front of the sheet to a respective portion of the imaging data of each of the one or more plate segments, the respective portion including the respective design area of the respective plate segment, and processing the sheet to form an imaged sheet that includes a set of one or more imaged plate segments;

for each respective plate segment on the sheet, marking the respective plate segment with one or more registration marks according to the respective marking data, such that the marking, the imaging, and the exposing produce one or more marked imaged plate segments on the sheet, the marking placing the one or more registration marks on the printing plate segment below the respective printing surface;

forming cutting data for controlling a controllable cutting device, and cutting out the one or more marked imaged printing plate segments from the sheet of printing plate material, producing one or more cut imaged plate segments;

forming mounting information for mounting the cut imaged plate segments on mounting material, the mounting using the registration marks, and positioning and mounting the cut marked imaged plate segment on the mounting material, using the one or more registration marks to aid the positioning, to form one or more positioned and mounted marked imaged plate segments on the mounting material for printing such that printing using the positioned and mounted marked imaged plate segment produces a print without the registration marks visible on the print, and wherein after printing using the mounted one or more printing plate segments, any of the plate segments with the registration marks thereon is unmountable from the mounting material and reusable for printing.

16. The method as recited in claim 15, wherein the registration marks are marked on each imaged plate segment after the exposing.

17. The method as recited in claim 15, wherein the registration marks are marked on each printing plate segment prior the exposing to imaging data.

18. The method as recited in claim 15, wherein the registration marks are marked on the floor of each plate segment.

19. The method as recited in claim 15, wherein the registration marks are marked on the back of each plate segment.

20. The method as recited in claim 15, wherein the registration marks are marked automatically on an x-y table using a marking tool controlled by the marking data after moving the sheet to the x-y table.

21. The method as recited in claim 20, wherein the marking tool is one of the set of tools consisting of a laser tool, a knife tool, a drill tool, and a pen tool.

22. A printing plate comprising:

a plurality of printing plate segments mounted and positioned on mounting material, each printing plate segment made of printing plate material and having a front surface and a back surface, each printing plate segment suitable for printing and comprising:

a design area comprising printing surface on the front surface defined by imaging data with which the printing plate segment was exposed and processed, and a floor below the printing surface, the defined printing surface and the floor being on and an integral part of the said exposed and processed plate segment, and made of the same one printing plate material, the printing surface corresponding to regions that would be visible and the floor corresponding to regions that would not be visible on a print made with the printing plate segment, the design area being defined by the convex hull of the regions of the printing surface that would be visible;

one or more registration marks marked below the printing surface of each plate segment, the one or more registration marks positioned according to marking data, such that one or more registration marks may be placed within the design area, and such that no matter whether the one or more registration marks are within the design area or outside the design area, the one or more registration marks are not visible on a print made with the printing plate segment, wherein the printing plate segment are positioned and mounted on the mounting material using the one or more registration marks to aid positioning, wherein printing using the printing plate with the positioned and mounted printing plate segments produces a print without the registration marks visible on the print, and wherein each marked imaged plate segment is unmountable and reusable after the printing.

23. The printing plate as recited in claim 22, wherein the marking is on the floor of plate segment.

24. The printing plate as recited in claim 22, wherein the marking is on the back surface of plate segment.

25. The printing plate as recited in claim 22, wherein the marking is carried out automatically on a cutting table using a marking tool controlled by digital data after moving the plate or plate segment prior to the cutting table, and wherein the marking tool is one of the set of tools consisting of a laser tool, a knife tool, a drill tool, and a pen tool.

26. A non-transitory computer-readable medium configured with a set of instructions that when executed by one or more processors of a processing system cause carrying out a method of creating data for a workflow in order to form one or more marked imaged plate segments the method comprising:

for each of one or more plate segments:
accepting imaging data for printing said each plate segment, the plate segment being made of a printing plate material and having a front and a back, with a to-be-imaged surface on the front, the respective imaging data for said each plate segment including respective image elements defining a respective design area for said each plate segment;
determining from the accepted imaging data respective marking data for one or more registration marks for marking said each plate segment,
wherein imaging and processing of said each plate segment forms a respective imaged plate segment having a front surface on the front of the plate segment a back surface on the back of the plate segment, the front surface including a printing surface and a floor below the printing surface, the printing surface and the floor being defined on and an integral part of the respective imaged plate segment, and made of the same one printing plate material, such that the printing surface of the respective imaged plate segment corresponds to regions that would be visible and the floor of the respective imaged plate segment corresponds to regions that would not be visible on a print made with the respective imaged plate segment, and
wherein the marking of said each plate segment marks the respective one or more registration marks below the respective printing surface that is formed by the printing and imaging, the marking being according to the respective determined marking data, such that no matter whether the one or more registration marks for said each plate segment are within or outside the respective design area, the one or more registration marks are not visible on a print made from the respective imaged plate segment; and
accepting or determining respective cutting data for cutting said each plate segment, the determining of the respective cutting data being from the respective imaging data for said each plate segment, the cutting data being for use in the workflow;

wherein the workflow comprises:
providing a sheet of printing plate material, the sheet having a plate back and a plate front, with the to-be-imaged surface on the plate front;
placing the sheet of printing plate material in an imager, exposing the plate front of the sheet to a respective portion of the imaging data for imaging of a respective plate segment, the portion including the respective design area of the respective plate segment, and processing the sheet to form an imaged sheet that includes a set of one or more imaged plate segments;
for each respective plate segment on the sheet, marking the respective plate segment with one or more registration marks according to the respective marking data, the marking, the imaging, and the exposing producing one or more marked imaged plate segments on the sheet, the marking placing the one or more registration marks on the printing plate segment below the respective printing surface, such that no matter whether the one or more registration marks that are on the marked imaged plate segment are within or outside the respective design area, the one or more registration marks are not visible on a print made from the marked imaged plate segment;
cutting the sheet into segments according to the cutting data to form marked imaged plate segments made of the printing plate material and having respective front and back surfaces, the respective printing surfaces being on the respective front surfaces;
positioning and mounting the marked imaged plate segment on mounting material, using the one or more registration marks to aid the positioning to form one or more positioned and mounted marked imaged plate segments for printing,
such that printing using the positioned and mounted marked imaged plate segment produces a print without the registration marks visible on the print, and
wherein the mounted cut marked imaged plate segments are reusable after the printing by unmounting, repositioning, and remounting at least one of the cut, marked imaged plate segment with the registration marks thereon to form a newly mounted marked imaged plate segment.

* * * * *